(12) United States Patent
Bennett (10) Patent No.: US 10,446,374 B2
(45) Date of Patent: Oct. 15, 2019

(54) PLASMA PROCESSING APPARATUS

(71) Applicant: SPTS TECHNOLOGIES LIMITED, Newport (GB)

(72) Inventor: Paul Bennett, Bristol (GB)

(73) Assignee: SPTS TECHNOLOGIES LIMITED, Newport (GB)

( * ) Notice: Subject to any disclaimer, the term of this patent is extended or adjusted under 35 U.S.C. 154(b) by 323 days.

(21) Appl. No.: 15/446,052

(22) Filed: Mar. 1, 2017

(65) Prior Publication Data
US 2017/0256384 A1    Sep. 7, 2017

(30) Foreign Application Priority Data

Mar. 1, 2016   (GB) .................................. 1603581.8

(51) Int. Cl.
| | | |
|---|---|---|
| *H01J 37/32* | (2006.01) | |
| *B08B 7/00* | (2006.01) | |
| *B08B 9/08* | (2006.01) | |
| *C23C 16/44* | (2006.01) | |
| *C23C 16/448* | (2006.01) | |
| *C23C 16/503* | (2006.01) | |

(Continued)

(52) U.S. Cl.
CPC ...... *H01J 37/32568* (2013.01); *B08B 7/0035* (2013.01); *B08B 9/08* (2013.01); *C23C 16/4405* (2013.01); *C23C 16/448* (2013.01); *C23C 16/503* (2013.01); *C23C 16/505* (2013.01); *H01J 37/321* (2013.01); *H01J 37/3211* (2013.01); *H01J 37/32541* (2013.01); *H01J 2237/334* (2013.01); *H01J 2237/335* (2013.01); *H01J 2237/3321* (2013.01); *H01L 21/67069* (2013.01)

(58) Field of Classification Search
CPC .......... H01L 32/32082; H01L 32/32449; H01J 49/105
See application file for complete search history.

(56) References Cited

U.S. PATENT DOCUMENTS 5,460,707 A    10/1995  Wellerdieck
6,020,686 A *   2/2000  Ye ..................... H01J 37/32082
                                                      315/111.21
(Continued)

FOREIGN PATENT DOCUMENTS

EP    0 467 045 A2    1/1992
EP    2 299 789 A1    3/2011
(Continued)

OTHER PUBLICATIONS

European Search Report Cited in European Application No. EP17 15 8675 dated Mar. 23, 2017.

*Primary Examiner* — Robert M Kunemund (74) *Attorney, Agent, or Firm* — Volentine, Whitt & Francos, PLLC (57) ABSTRACT

A plasma processing apparatus for plasma processing a substrate comprising includes a chamber having one or more walls, in which a portion of the walls of the chamber is an electrode structure formed from a metallic material and configured to act as a primary winding of an inductively coupled plasma source, and an electrical signal supply device for supplying an electrical signal that drives the electrode structure as a primary winding of an inductively coupled plasma source to sustain an inductively coupled plasma within the chamber.

22 Claims, 9 Drawing Sheets

(51) Int. Cl.
    *C23C 16/505*    (2006.01)
    *H01L 21/67*     (2006.01)

(56) References Cited

U.S. PATENT DOCUMENTS

| | | | |
|---|---|---|---|
| 9,607,819 B1* | 3/2017 | Nazarov | H01J 49/105 |
| 2004/0026231 A1 | 2/2004 | Prilbyl | |
| 2009/0145554 A1* | 6/2009 | Weichart | H01J 37/321 |
| | | | 156/345.35 |
| 2014/0062296 A1 | 3/2014 | Yamazawa et al. | |
| 2015/0325414 A1* | 11/2015 | Dhindsa | H01J 37/32449 |
| | | | 156/345.26 |

FOREIGN PATENT DOCUMENTS

| | | |
|---|---|---|
| EP | 2299789 A1 | 3/2011 |
| WO | WO 96/18208 A1 | 6/1996 |
| WO | WO 97/08734 A1 | 3/1997 |
| WO | WO 2011/022612 A2 | 2/2011 |

* cited by examiner

PLASMA PROCESSING APPARATUS

BACKGROUND

This invention relates to a plasma processing apparatus. The invention relates also to an associated method of plasma processing.

Figure 1A:
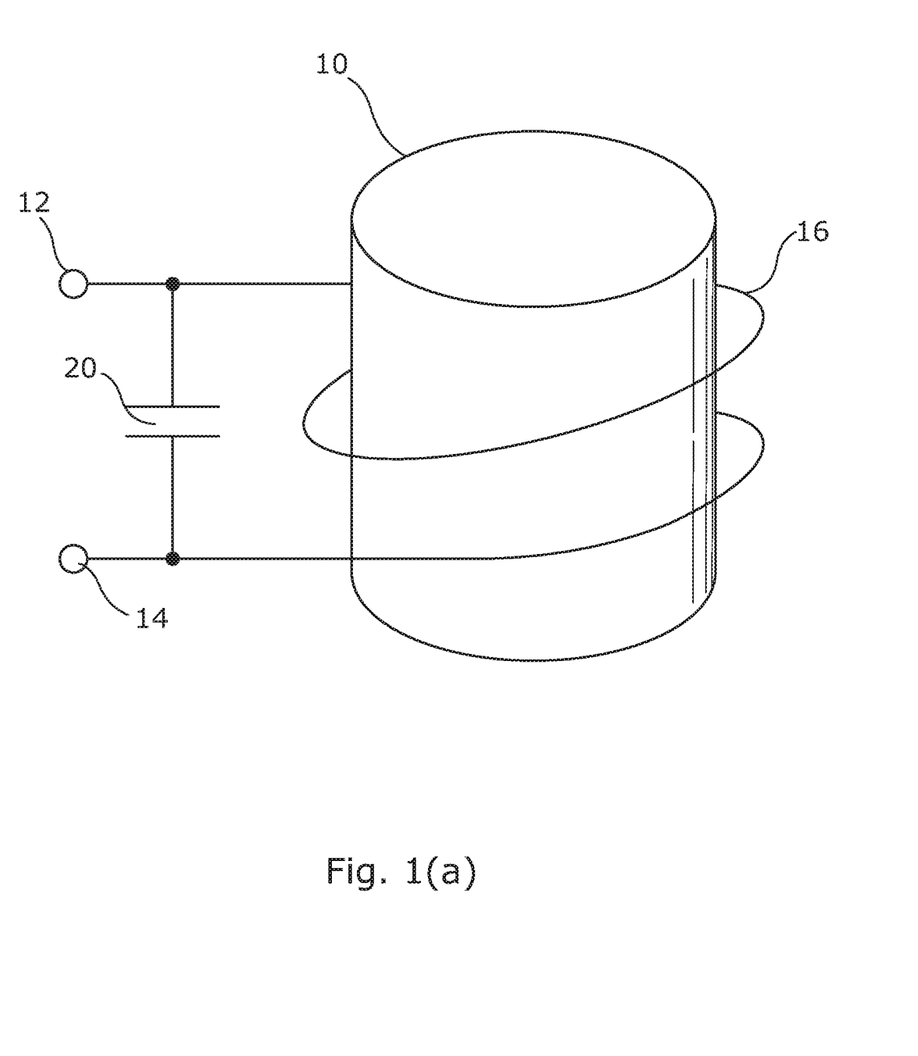
FIGS. 1(a) and 1(b) respectively show a two turn and a single turn prior art ICP processing apparatus.
Figure 1B:
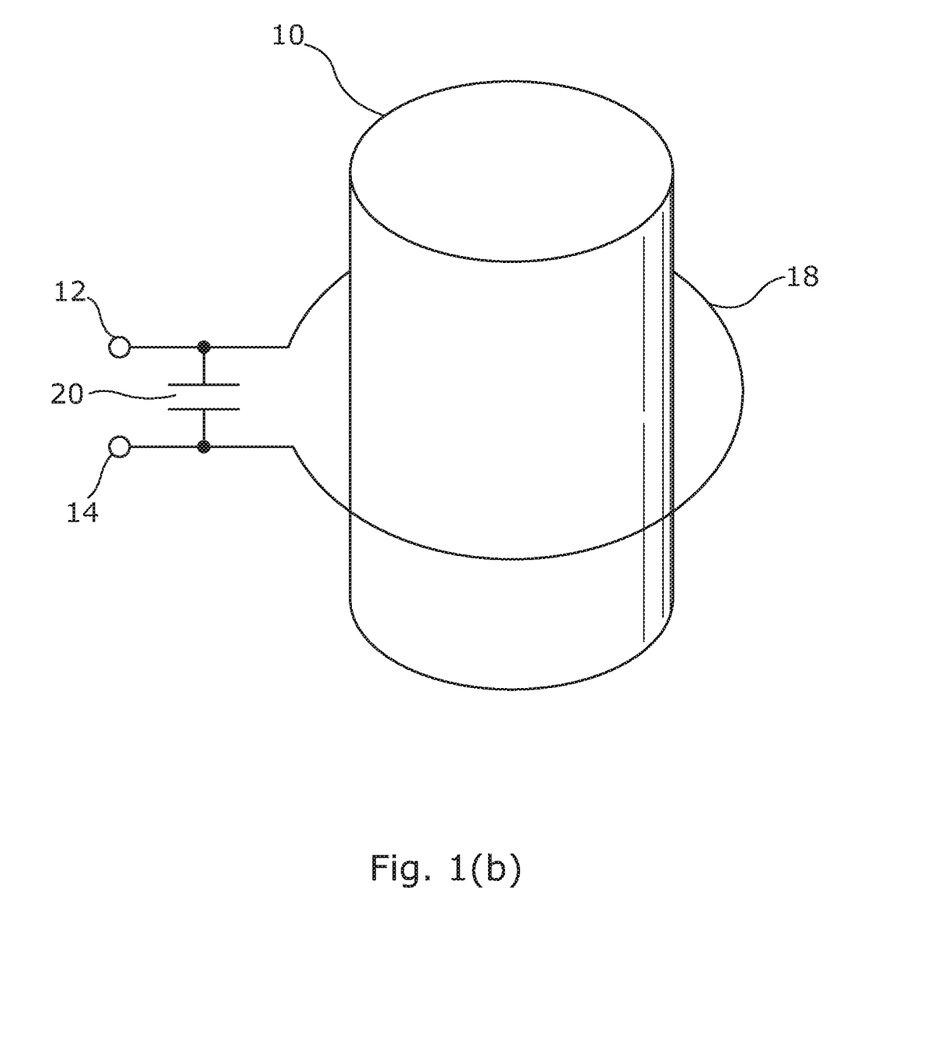

Many industrial applications involve the use of a plasma to produce active species such as ions, electrons, atoms, molecules and radicals to meet a process requirement. Frequently, there is a need to operate at higher power densities in order to increase reaction speeds. One of the more commonly used types of plasma source in semiconductor or flat panel processing is the inductively coupled plasma (ICP) reactor. Typically, RF power is applied to an externally positioned antenna, coil or band resulting in inductive coupling of energy into the process chamber through a dielectric container or window. A suitable gas or gaseous mixture is introduced into the process chamber at a relatively low pressure and a gas discharge is produced. FIGS. 1a and b show examples of prior art ICP designs. Both FIGS. 1a and b show a process chamber 10 having a dielectric cylindrical body, RF feed points 12, 14 and a tuning capacitor 20. FIG. 1a shows a two turn ICP coil 16 which is externally positioned around the dielectric portion of the chamber 10. FIG. 1b shows a single turn ICP coil externally positioned around the dielectric region of the chamber 10. The removal of heat from this type of system can be a problem, owing to the relatively poor thermal conductivity of conventional dielectric materials. It is possible to use more advanced dielectric materials with improved thermal characteristics. An example of an advanced dielectric material is AlN. However, these advanced materials are costly and also they impose design limitations which limit their use in many applications.

SUMMARY

The present invention, in at least some of its embodiments, addresses the above mentioned problems and needs.

According to a first aspect of the invention there is provided a plasma processing apparatus for plasma processing a substrate comprising:
- a chamber comprising one or more walls, in which a portion of the walls of the chamber is an electrode structure formed from a metallic material and configured to act as a primary winding of an inductively coupled plasma source; and
- an electrical signal supply device for supplying an electrical signal that drives the electrode structure as a primary winding of an inductively coupled plasma source to sustain an inductively coupled plasma within the chamber.

The metallic electrode structure had the advantage of being relatively easy to cool. This can enable at least one of high power operation, high pressure operation, and high thermal loading to be achieved without requiring the use of a thermally robust dielectric chamber wall formed from an exotic material such as AlN.

The electrode structure may be a single turn structure.

The electrode structure may be a single non-continuous band forming a single turn around a periphery of the chamber.

Alternatively, the electrode structure may comprise a plurality of spaced apart band segments. The band segments may form a single turn around a periphery of the chamber. The band segments may be spaced apart by portions of the chamber wall formed from a dielectric material.

The band segments may be connected in parallel to the electrical signal supply device. This reduces the magnitude of the voltage that must be applied to each segment for operation of the apparatus. This assists in suppressing electric coupling around the feed points of the electrode structure.

Any appropriate number of band segments may be utilised. In some embodiments, the electrode structure comprises two to six band segments.

The band segments may be grounded at their midpoints. This can assist in minimizing sputtering or other undesirable affects associated with the applied electrical voltage.

A lower region of the electrode structure may comprise one or more discontinuities which prevent the formation of a primary current flow in said lower region. The discontinuities may be slots formed in the electrode structure. The discontinuities may be filled with a dielectric material.

In embodiments in which the electrode structure comprises a plurality of spaced apart band segments, the lower region of each band segment in the electrode array may comprise a discontinuity.

The discontinuities can act break up the path of primary current flow. This forces the current to circulate only in the upper region of the electrode structure. As a result, the plasma can be confined to the upper region of the electrode structure. The metallic electrode structure is relatively easy to cool. This avoids undesirable heating of other areas of the apparatus which might be caused if the plasma were to extend beyond the electrode structure.

The electrode structure may be a coil. The coil may be a single turn structure.

The metallic material may be a metal such as aluminium.

Typically, the electrode structure is in direct communication with the interior of the chamber. This reduces any transformer action leakage inductance since the primary winding (the electrode structure) is immediately adjacent to the secondary winding (the inductively coupled plasma). This leads to more efficient coupling. A further advantage is that it is possible to operate with a plasma over a wider range of power and pressure conditions. Typically, the electrode structure extends through at least one chamber wall from an outer surface to an inner surface thereof.

The chamber may comprise a top portion, a body portion and a lower portion. The electrode structure may be located in the body portion. The body portion may be generally cylindrical. The body portion may comprise an upper section, a middle section and a lower section. The electrode structure may be located in the middle section. The upper and lower sections may be formed from a dielectric material.

The apparatus may comprise a substrate support. The substrate support supports a substrate which is plasma processed by the apparatus. The substrate support may be positioned within the chamber. Alternatively, the substrate support may be positioned within a further chamber. The apparatus may further comprise a loading mechanism for loading the substrate onto the substrate support.

The substrate support may be configured to receive a planar substrate such as a semiconductor wafer or a flat panel substrate.

Typically, the remaining portion of the chamber wall or walls not constituted by the electrode structure is formed from one or more dielectric materials. Any suitable dielectric material, such as a ceramic, alumina, or quartz, may be used.

The apparatus may further comprise a cooling system for cooling the electrode structure. The cooling system may comprise channels formed in the electrode structure to permit a coolant fluid to be flowed therethrough. This is a very convenient way of achieving significant cooling of the electrode structure in a very straightforward manner.

The apparatus may comprise a single chamber having the electrode structure or the apparatus may comprise multiple chambers.

In the case of multiple chambers, the apparatus may comprise a first chamber having the electrode structure which acts as a plasma source, and one of more further chambers in which plasma processing takes place.

The apparatus may be configured as a source of one or both of ions and radicals which are used for the plasma processing.

The electrical signal supply device may supply a RF electrical signal that drives the electrode structure.

An additional electrical signal may be applied to the electrode structure in order to initially strike a plasma. The additional electrical signal may be a RF, AC or DC electrical signal. The additional electrical signal may be applied using an auxiliary electrical signal supply device. Additional electrical signal may be applied between source and ground. In embodiments in which the electrode structure comprises a plurality of spaced apart band segments, adjacent band segments can be powered using alternate polarities of the additional electrical signal.

The RF electrical signal may be coupled by high pass filtering.

According to a second aspect of the invention there is provided a method of plasma processing a substrate comprising the steps of:
providing an apparatus according to the first aspect of the invention; and
supplying an electrical signal to the electrode structure to drive the electrode structure as primary winding of an inductively coupled plasma source thereby sustaining an inductively coupled plasma within the chamber which is used to perform the plasma processing.

The plasma processing may be performed to process a substrate which is positioned in the apparatus. The apparatus may comprise a substrate support. In these embodiments, the method may comprise the step of loading the substrate onto the substrate support. However, it is not necessary that a substrate support is present and the substrate may be positioned in the chamber in a different way. The plasma processing may form a feature or coating on the substrate.

The substrate may be a semiconductor substrate. The semiconductor substrate may be a semiconductor wafer, such as a silicon wafer.

The plasma processing may be a semiconductor processing technique. The substrate may be any substrate suitable for processing in this way. The semiconductor processing technique may process a semiconductor feature already present on the substrate or it may deposit a new feature onto to the substrate. The semiconductor processing technique may be an etch technique or a deposition technique such as Plasma enhanced chemical vapour deposition (PE-CVD). A deposition technique may be used to deposit films of micron and sub-micron thickness.

The substrate may be a flat panel, such as a LCD flat panel.

The substrate may be formed from a metal or have a surface to be processed which is formed from a metal. The plasma processing may form a coating on the substrate. The coating may be a nitride coating.

The substrate may be a tool part.

The plasma processing may be a chamber cleaning process.

The plasma processing may use one or both of ions and radicals which are produced in the plasma.

The apparatus may comprise multiple chambers. The apparatus may comprise a first chamber having the electrode structure which acts as a plasma source, and one or more further chambers in which plasma processing takes place. The first chamber may provide a source of radicals. The plasma processing may be a radical based plasma process. The radicals may be F, N, O or any other suitable radical species. The plasma processing may be cleaning of a further chamber or processing of a substrate positioned in a further chamber. Processing of a substrate positioned in a further chamber may comprise a CVD process. The CVD process may be CVD epitaxy.

Whilst the invention is described above, it extends to any inventive combination of the features set out above or in the following description, drawings or claims. For example, any feature described in relation to the first aspect of the invention is also disclosed in combination with the second aspect of the invention and visa versa.

BRIEF DESCRIPTION OF THE DRAWINGS

Embodiments of apparatus and methods in accordance with the invention will now be described with reference to the accompanying drawings, in which.

DETAILED DESCRIPTION OF EMBODIMENTS

Figure 2:
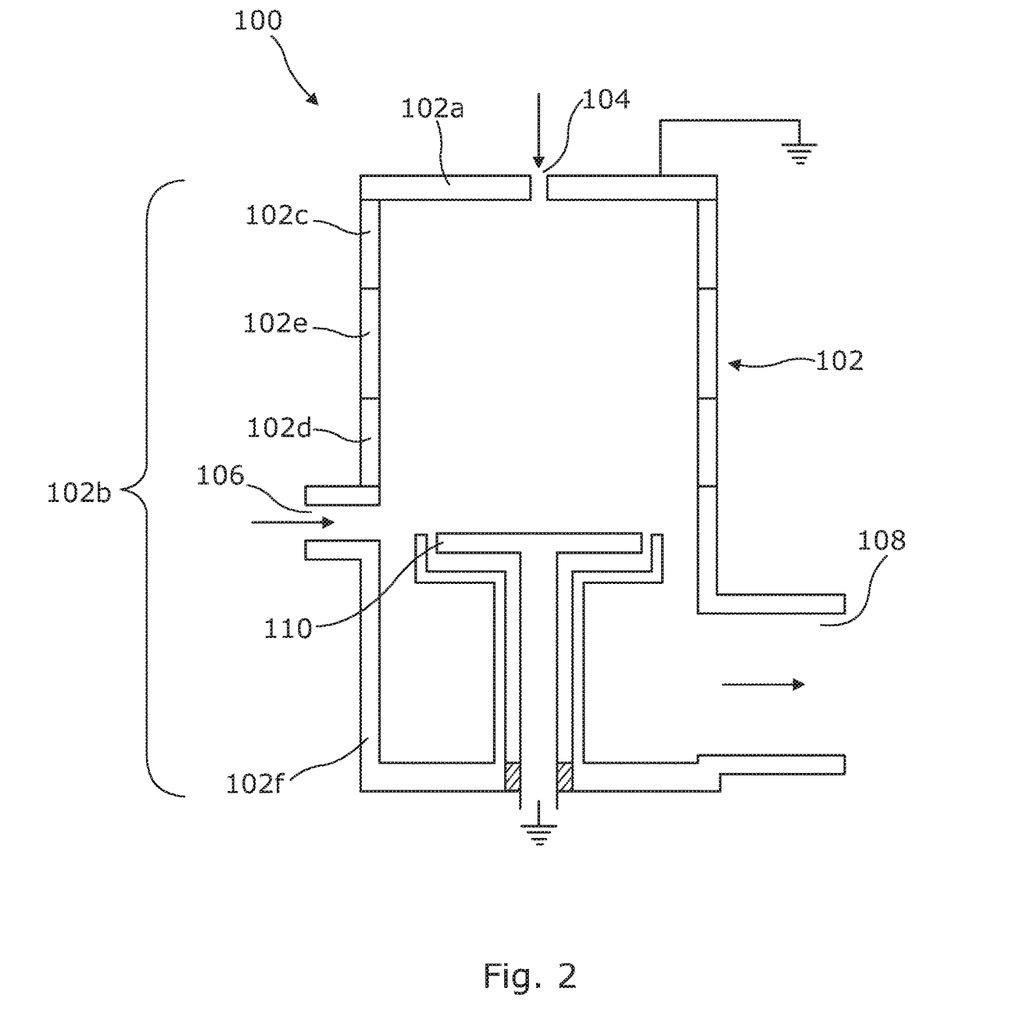
FIG. 2 is a cross sectional view of a first embodiment of an apparatus of the invention.

FIG. 2 shows a first embodiment of a plasma processing apparatus of the invention, depicted generally at 100. The apparatus 100 comprises a chamber 102 having a suitable gas inlet 104 disposed in a top portion 102a thereof. The chamber 102 further comprises a generally cylindrical body 102b. The body 102b comprises an upper dielectric portion 102c, a lower dielectric portion, 102d and an electrode structure 102e which is positioned between the upper and lower dielectric sections 102c, d. The body portion 102b further comprises a base section 102f having a wafer loading slot 106 and a pumping port 108 which may be connected to a suitable pumping arrangement such as a vacuum line leading to a turbomolecular pump. The interior of the chamber 102 houses a platen 110 on which a substrate such as a wafer may be loaded. The platen 110 as shown in FIG. 1 is in a lowered position for receiving the substrate. The platen 110 would then subsequently be raised into an elevated position prior to commencement of plasma processing. The platen 110 can be of any suitable form such as an electrostatic chuck. Other forms of clamping of the substrate, such as mechanical clamping, might be utilized as desired. With some plasma processing operations, it may be desirable to apply an electrical bias signal, such as RF bias signal, to the platen 110 as is well known in the art. The platen may be heated using known means.

The body portion 102b of the chamber and each of the upper dielectric section 102c, lower dielectric section 102d and electrode structure 102e are generally cylindrical. The upper and lower dielectric sections 102c, d are formed from a suitable dielectric material such as a ceramic or quartz. The electrode structure 102e is formed from a suitable metallic material such as aluminium.

Figure 3:
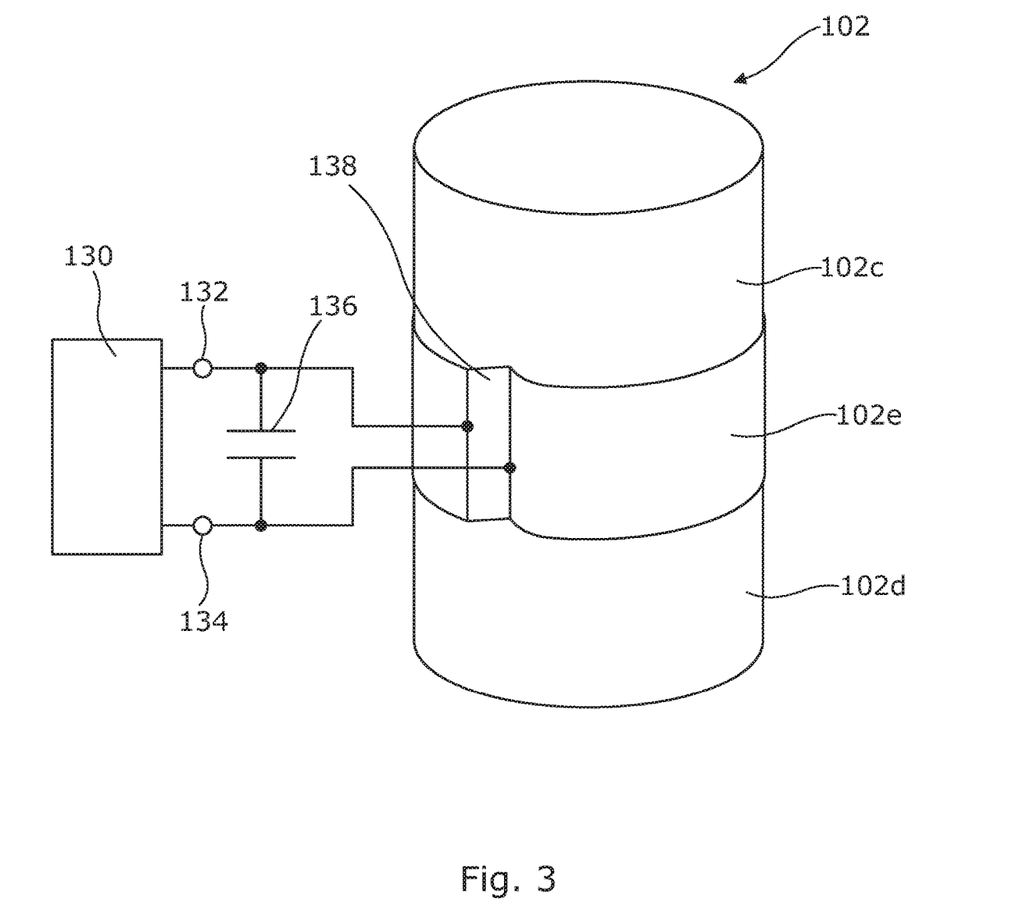
FIG. 3 is a perspective view of a portion of the chamber of FIG. 1 in connection with a RF source.

FIG. 3 is perspective view of the stack comprising the upper and lower dielectric sections 102c, d and the electrode structure 102e. For reasons of presentational simplicity, the other elements of the apparatus 100 are not shown in FIG. 3. FIG. 3 also shows electrical connections to the electrode structure 102e. More specifically, the electrode structure 102e is in electrical connection with an RF power supply 130 through feed points 132, 134. A capacitor 136 is connected across the feed points 132, 134. The capacitor 136 tunes the electrode structure 102e to the drive frequency provided by the RF power supply 130. The frequency of the RF electrical signal provided by the RF power 130 may be 13.56 MHz, 2 MHz or any other convenient frequency. Frequency tuning may be employed to provide matching over a range of power and pressure conditions. Matching may be achieved using PI or L networks or transformers. It can be seen that the electrode structure 102e is in form of a non-continuous band which constitutes part of the chamber itself and also constitutes a single turn structure of an ICP plasma source for generating an inductively coupled plasma within the interior of the chamber 102. The skilled reader will appreciate that the single turn electrode structure 102e cannot extend completely around the periphery of the body portion of the chamber. Instead, a dielectric break 138 is provided which separates one circumferential end of the electrode structure from the other circumferential end. The dielectric break can be made of any convenient dielectric material. Typically the dielectric break is made of the same dielectric material that the upper and lower dielectric sections 102c, d are formed from. Typically, the electrode structure extends around the majority of the circumference of the chamber 102. For example, the electrode structure may extend around 320° or more of the periphery of the chamber and the dielectric break may extend around 40° or less of the periphery of the chamber.

It will be appreciated that the apparatus described in FIGS. 2 and 3 utilises an ICP source which is fundamentally different from the prior art ICP sources of the type described above in relation to FIG. 1. In particular, the ICP source of the invention utilises the chamber wall itself as the primary winding of the ICP source. Therefore, the primary winding is immediately adjacent to the inductively coupled plasma itself within the chamber. This can lead to more efficient coupling and wider power/pressure operation regime. Operation at high power, high pressure, and/or high thermal loading is also possible.

Figure 4A:
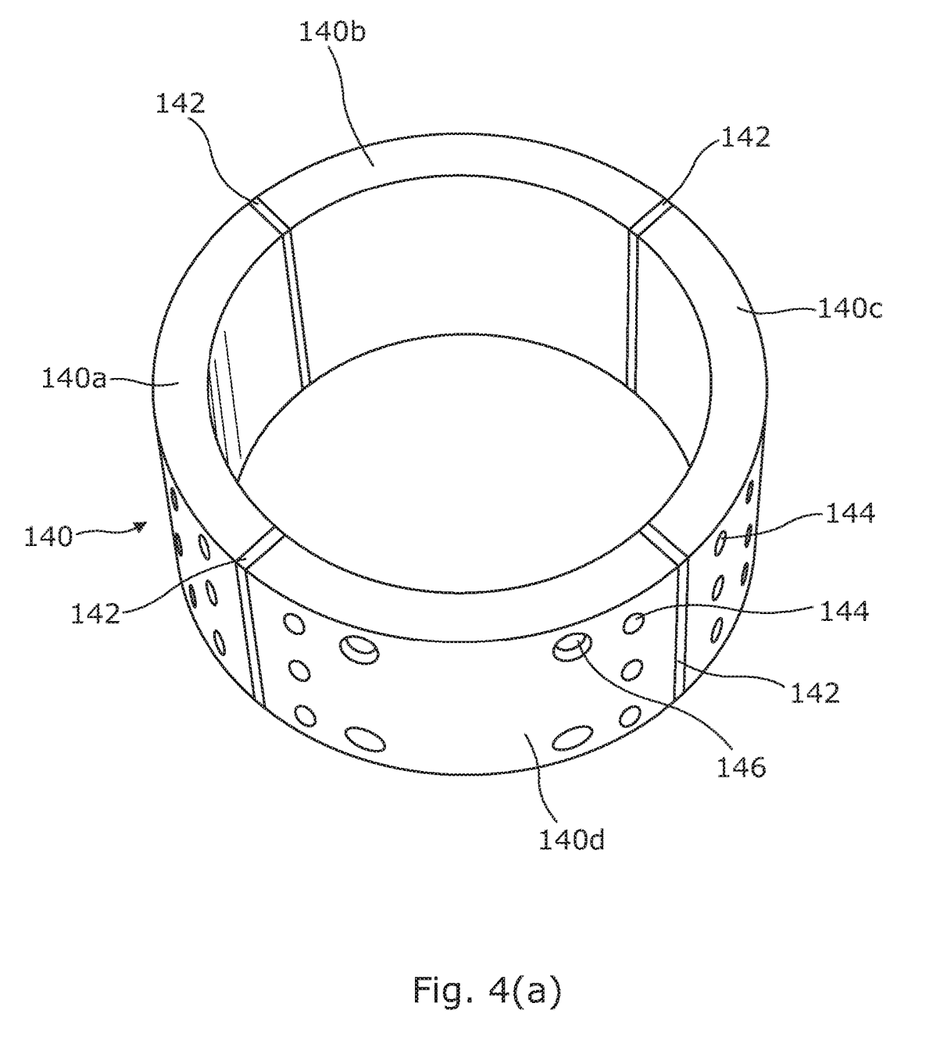
FIGS. 4(a) and 4(b) respectively show an elevated perspective view of a band segment arrangement and an elevated perspective view of a second embodiment of an apparatus of the invention.
Figure 4B:
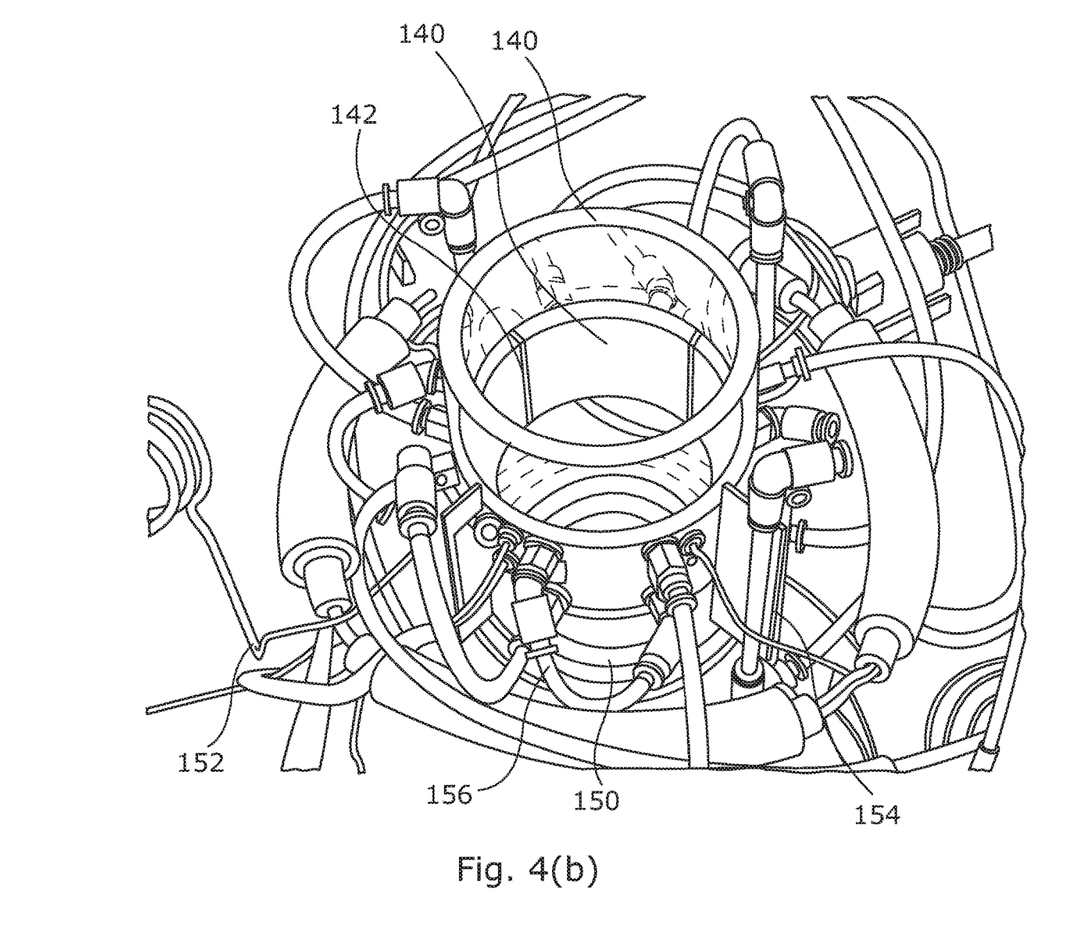

The initial striking of the plasma may be assisted by using an additional RF, AC or DC potential which may be briefly applied between the source and ground. The use of a lower gas pressure in the chamber to facilitate ignition of the plasma is also possible. Once the plasma is struck, a higher operating pressure might be used for processing of the substrate. FIGS. 4a and b show a second embodiment of the invention. FIG. 4a shows a cylindrical electrode structure 140 which is another single turn structure that can be used as part of an ICP source. The single turn electrode structure 140 comprises a plurality of spaced apart band segments 140a, b, c, d. Adjacent band segments are separated by relatively thin dielectric breaks 142. The dielectric breaks can be formed from a dielectric material such as ceramic or quartz. However, a relatively thick layer of adhesive can be used to provide sufficient isolation and maintain structural integrity of the electrode structure. Each band segment has apertures 144 formed therein allowing electrical connection to be made to the RF source. Additionally, each band segment comprises apertures 146 allowing connection to a cooling system which supplies a cooling fluid. The band segments further comprise internal passageways (not shown) which permit circulation for cooling fluid within the band segments. FIG. 4b shows the band electrode structure 140 of FIG. 4a interposed between an upper dielectric section 148 and a lower dielectric section 150. It will be appreciated that the three part cylindrical structure shown in FIG. 4b is similar to the arrangement shown in FIG. 3. The structure shown in FIG. 4b can be used as part of a chamber of the type shown in FIG. 2. Also shown in FIG. 4b are RF feed lines 152 and tuning capacitors 154 which are connected across RF feed lines associated with adjacent band segments. Water cooling connections 156 are also shown in FIG. 4b. The water cooling connections are in operative connection with the apertures 146 shown in FIG. 4a.

Figure 5:
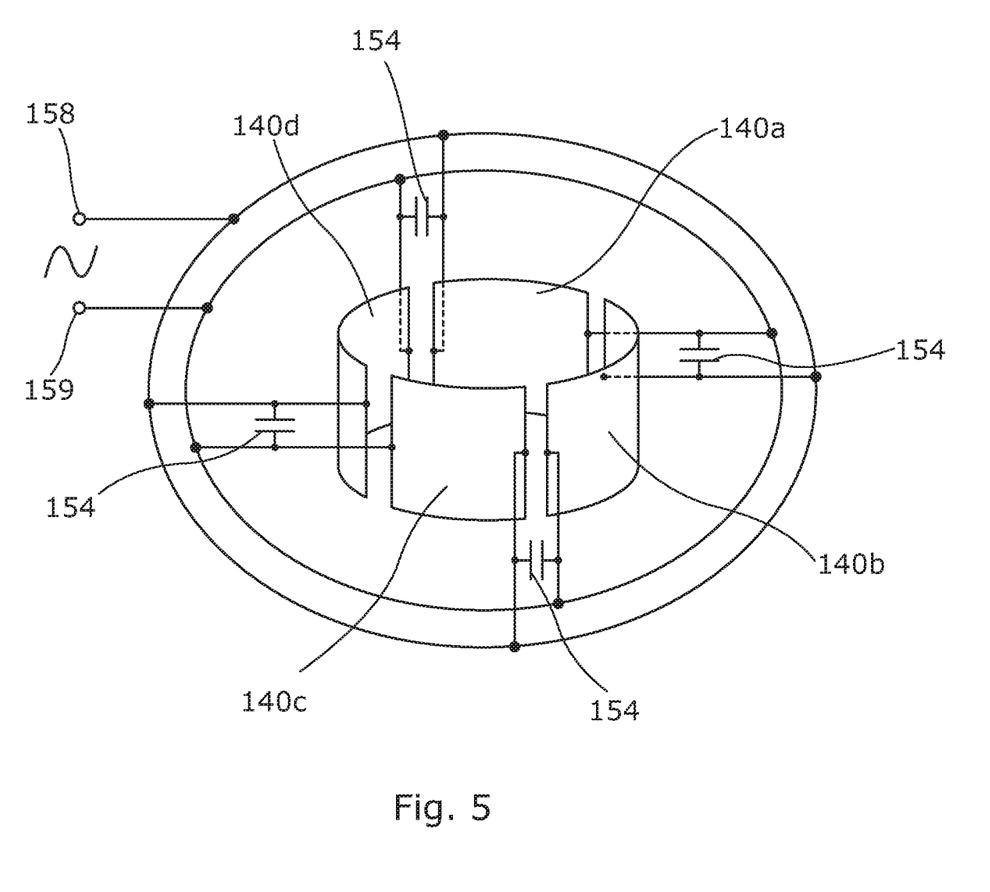
FIG. 5 shows electrical connections to the band segment arrangement of FIG. 4 (a)

FIG. 5 shows an electrical circuit which may be used to drive the band segments shown in FIG. 4 with RF power from an RF power supply (not shown) via feed points 158, 159. The band segments 140a-d are connected in parallel with tuning capacitors 154 connected across adjacent band segments. The use of N sections connected in parallel reduces the applied voltage by a factor N. This can be advantageous in suppressing electric coupling around the dielectric breaks and feed points. However, it is also possible to drive the band segments in series. If a single turn with one dielectric brake is tuned by capacitance, then for a structure comprising N band segments, each dielectric is tuned by CN. In the arrangements shown in FIGS. 4 and 5, N is four. Other values of N are possible. With a high N value the impedance may be less than 50 Ohms. In this instance, a step down from a typical generator may be required. In the four segment arrangement, the voltage applied is similar to that used in powering a single turn chamber wall. In these embodiments, the impedance may be reasonably close to 50 Ohms, allowing more efficient matching. High circulating currents only flow through the wall and the tuning capacitors.

As noted above, striking of the plasma can be assisted by using additional RF, AC or DC potentials briefly applied between the source and ground. In the case of electrode structures having a plurality of segments, is possible to power adjacent segments with alternate polarities of an additional power supply used for striking up a plasma. The band segments can have their midpoints grounded to minimize sputtering and other undesirable effects associated with the applied voltage. Selective grounding of the segments can also be used to assist in striking the plasma.

Plasmas were produced using the apparatus shown in FIGS. 4 and 5. Approximate dimensions of the electrode structure were ~70 mm diameter, 30 mm height with 6.35 mm thick aluminium band segment walls (ID~57 mm). The dielectric sections 148, 150 were formed from quartz with ~70 mm OD and ~50 mm height. Epoxy was used to bond the components together to provide a vacuum seal and isolation.

Figure 6:
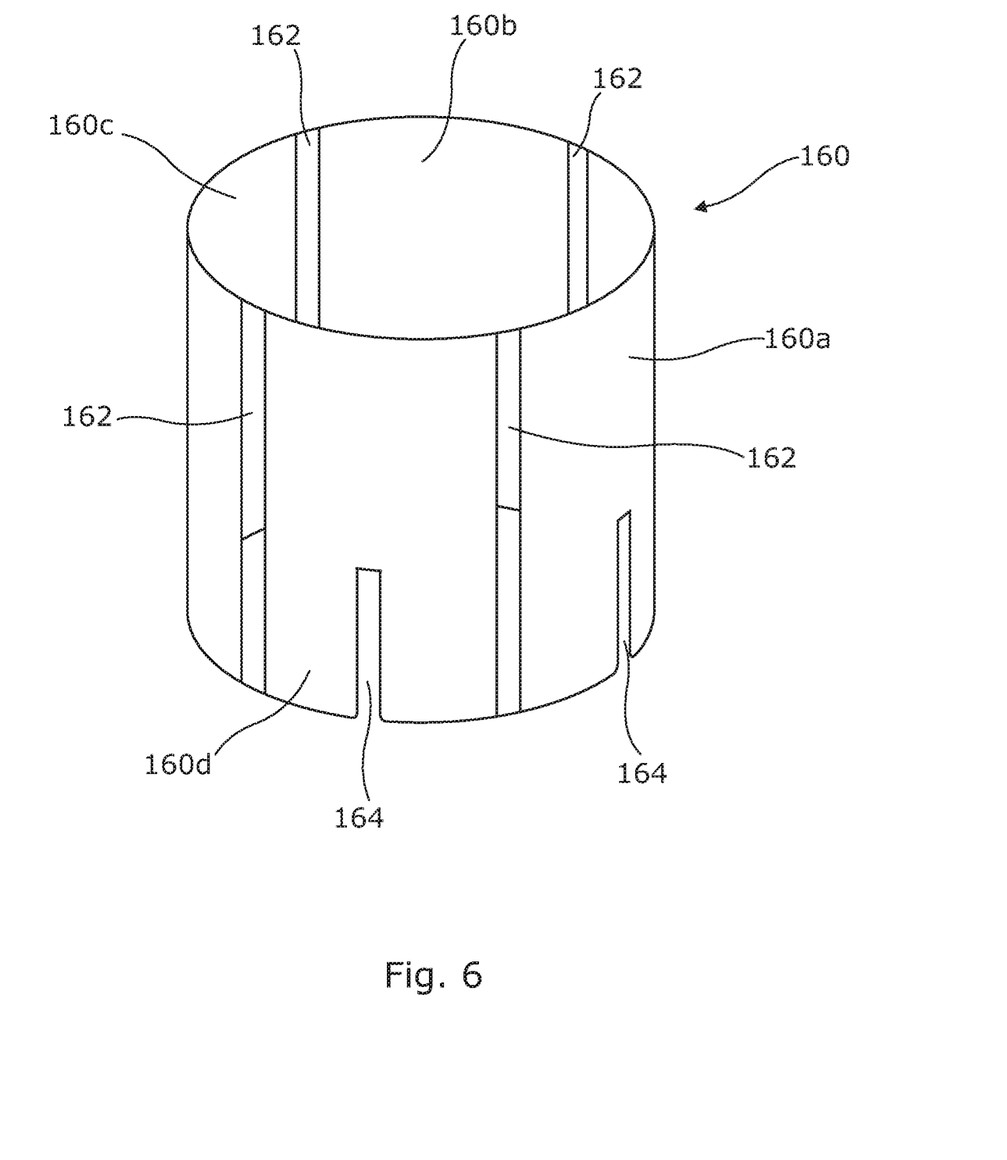
FIG. 6 shows a further embodiment of an electrode structure.

Typical process conditions were ~3 slpm $N_2$, 10 Torr pressure using 1.3 kW RF (at 13.65 MHz). It will be appreciated that these conditions and configurations are merely representative and many other variations are possible. It is has been realised that, under many typical operating conditions, the plasma formed in the chamber is blown downstream (i.e., towards the substrate support and the pumping port). This results in plasma being formed at the downstream edge of the electrode structure. This can then thermally stress the lower dielectric section more than the upper dielectric section. FIG. 6 shows a further embodiment of an electrode structure, depicted generally at 160, which can reduce this unwanted thermal loading of the lower dielectric section.

The electrode structure 160 comprises four band segments 160a-d which are separated by dielectric breaks 162. Each band segment has a discontinuity formed in a lower portion thereof, i.e., the region of each band segment which is closest to the pumping port. As shown in FIG. 6, the discontinuities 164 can be a longer longitudinally extending slot, although other arrangements are possible. The discontinuities may be filled with a dielectric material although there may be instead no material disposed in the discontinuity. The discontinuities act to break up the path of primary current flow through the band segments. This results in primary current flow only circulating in the upper portions of the band segments. This can result in the plasma being confined to the upper regions of the band segments only so that, in use, the region of high thermal loading associated with the plasma remains inside the principally metallic electrode structure. This is advantageous because the metallic electrode structure is easy to cool, for example using a cooling fluid based system.

The electrode structure may be connected to the upper and lower dielectric sections by any convenient means, such as through adhesives, flanges, o rings, or other means. In principle, it may be possible to provide a unitary structure formed using advanced deposition techniques.

Figure 7:
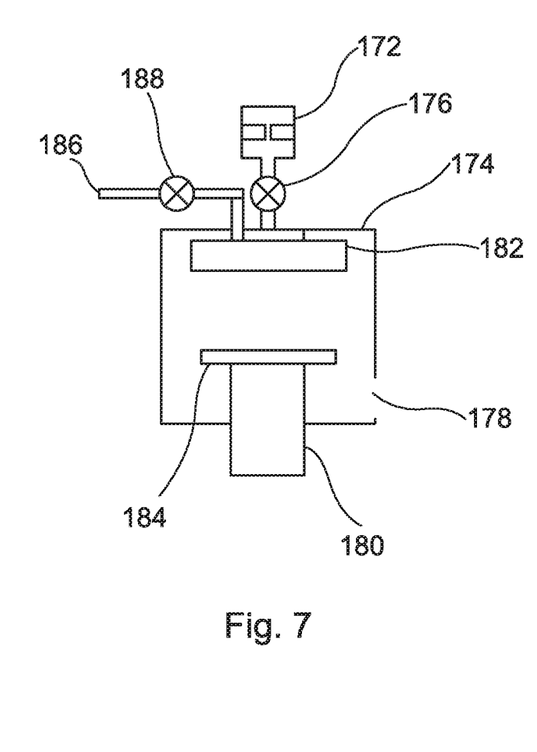
FIG. 7 shows a third embodiment of an apparatus of the invention.

It is possible to provide apparatus of the invention which comprise multiple chambers. FIG. 7 shows a third embodiment of a plasma processing apparatus of the invention, depicted generally at 170. The apparatus comprises a first chamber 172 and a second chamber 174. The first chamber 172 includes an electrode structure which is configured to act as a primary winding of inductively coupled plasma source in accordance with the principles set out above. The first chamber 172 acts as a plasma source for supplying radicals to the second chamber 174. The first chamber 172 is in communication with the second chamber 174 via an isolation valve 176. The second chamber 174 comprises a pumping port 178, a platen 180 and a shower head arrangement 182. The platen 180 supports a wafer 184. The shower head 182 introduces suitable process gases into the second chamber 174. The process gases are supplied through a gas supply system 186 which comprises an isolation valve 188. The apparatus 170 can function as a PE-CVD tool. The arrangement shown in FIG. 7 is particularly useful for cleaning the second chamber 174. If the plasma was provided in the chamber 174 itself, either by electrically driving the shower head 182 or the platen 180, then ion-bombardment would occur which typically will wear down the chamber parts over a period of time. By providing the two chamber arrangement shown in FIG. 7, is possible for the first chamber 172 to supply radical species to the second chamber 174 with no significant concentrations of ions reaching the second chamber 174. In this way, a fast, low damage clean can be provided. The wafer 184 may not be present in the chamber during the cleaning process. In the case of silicon dioxide or silicon nitride cleans, fluorine radicals might be used, although the supply of other radicals is possible.

Figure 8:
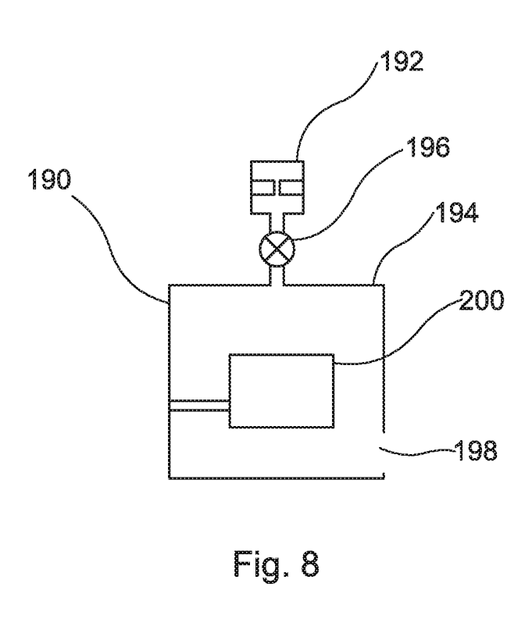
FIG. 8 shows a fourth embodiment of an apparatus of the invention.

FIG. 8 shows a fourth embodiment of a plasma processing apparatus of the invention, depicted generally at 190. The apparatus 190 is another multiple chamber arrangement comprising a first chamber 192 and a second chamber 194. Similar to the arrangement shown in FIG. 7, the first chamber 192 comprises an electrode structure which is configured to act as a primary winding of an inductively coupled plasma source. The first chamber acts as a plasma source which supplies radicals to the second chamber 194 via an isolation valve 196. The second chamber 194 comprises a pumping port 198. In the embodiment shown in FIG. 8, a part 200, such as tool part, is suitably positioned in the second chamber 194. The radicals supplied by the first chamber 192 are used to modify the surface of the part 200 in a desired way. For example, the part 200 may be a metal drill bit which is plasma processed to provide a nitride coating. Again, it is advantageous that the first chamber 192 can provide a source of radicals so that plasma processing can occur without any significant ion bombardment. Any suitable radical species, such as nitrogen or oxygen radicals, might be used. The apparatus 190 shown in FIG. 8 might be used to provide other forms of radical based plasma processing where ion bombardment is unwanted. For example, apparatus of this type can be used in epitaxial CVD. Ions (which tend to be quite directional) are unwanted because they can cause dislocations and defects in the growing crystal. A further advantage is that the temperature of the epitaxial cvd process can be reduced.

What is claimed is:

1. A plasma processing apparatus for plasma processing a substrate comprising:
    a chamber comprising one or more walls, in which a portion of the walls of the chamber is a single turn electrode structure formed from a metallic material and configured to act as a primary winding of an inductively coupled plasma source; and
    an electrical signal supply device for supplying an electrical signal that drives the single turn electrode structure as a primary winding of an inductively coupled plasma source to sustain an inductively coupled plasma within the chamber,
    wherein the single turn electrode structure is a single non-continuous band forming a single turn around a periphery of the chamber.

2. A plasma processing apparatus for plasma processing a substrate comprising:
    a chamber comprising one or more walls, in which a portion of the walls of the chamber is single turn electrode structure formed from a metallic material and configured to act as a primary winding of an inductively coupled plasma source; and
    an electrical signal supply device for supplying an electrical signal that drives the single turn electrode structure as a primary winding of an inductively coupled plasma source to sustain an inductively coupled plasma within the chamber,
    wherein the single turn electrode structure comprises a plurality of spaced apart band segments forming a single turn around a periphery of the chamber.

3. Apparatus according to claim 2 in which the band segments are spaced apart by portions of a chamber wall formed from a dielectric material.

4. Apparatus according to claim 2 in which the band segments are connected in parallel to the electrical signal supply device.

5. Apparatus according to claim 2 in which the band segments are grounded at their midpoints.

6. Apparatus according to claim 1 in which a lower region of the single turn electrode structure proximal to the substrate support comprises one or more discontinuities which prevent the formation of a primary current flow path in said lower region.

7. Apparatus according to claim 6 in which the discontinuities are slots formed in the single turn electrode structure.

8. Apparatus according to claim 2 in which a lower region of each band segment in the electrode structure comprises a discontinuity which prevents the formation of a primary current flow pattern in said lower region.

9. Apparatus according to claim 1 in which the metallic material is a metal.

10. Apparatus according to claim 1 in which the single turn electrode structure is in direct communication with the interior of the chamber.

11. Apparatus according to claim 10 in which the single turn electrode structure extends through at least one chamber wall from an outer surface to an inner surface thereof.

12. Apparatus according to claim 1 further comprising a substrate support positioned within the chamber.

13. Apparatus according to claim 1 comprising a first chamber having the single turn electrode structure which acts as a plasma source and one or more further chambers in which plasma processing takes place.

14. Apparatus according to claim 1 in which the electrical signal supply device supplies a RF electrical signal that drives the single turn electrode structure.

15. A method of plasma processing a substrate comprising the steps of:
providing an apparatus according to claim 1; and
supplying an electrical signal to the single turn electrode structure to drive the single turn electrode structure as a primary winding of an inductively coupled plasma source thereby sustaining an inductively coupled plasma within the chamber which is used to perform the plasma processing.

16. A method according to claim 15 in which the plasma processing is performed to process a substrate which is positioned in the apparatus.

17. A method according to claim 16 in which the substrate is a semiconductor substrate or a flat panel.

18. A method according to claim 15 in which the plasma processing is a chamber cleaning process.

19. A method according claim 15 in which the apparatus comprises a first chamber having the single turn electrode structure which acts as a plasma source, and one or more further chambers in which the plasma processing takes place.

20. A method according to claim 19 in which the first chamber is a source of radicals which are used for the plasma processing.

21. A method of plasma processing a substrate comprising the steps of:
providing an apparatus according to claim 2; and
supplying an electrical signal to the single turn electrode structure to drive the single turn electrode structure as a primary winding of an inductively coupled plasma source thereby sustaining an inductively coupled plasma within the chamber which is used to perform the plasma processing.

22. A method according claim 21 in which the apparatus comprises a first chamber having the single turn electrode structure which acts as a plasma source, and one or more further chambers in which the plasma processing takes place.

* * * * *